(12) United States Patent
Li et al.

(10) Patent No.: US 9,780,079 B2
(45) Date of Patent: Oct. 3, 2017

(54) SEMICONDUCTOR DIE ASSEMBLY AND METHODS OF FORMING THERMAL PATHS

(71) Applicant: Micron Technology, Inc., Boise, ID (US)

(72) Inventors: Jian Li, Boise, ID (US); Steven K. Groothuis, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/700,222

(22) Filed: Apr. 30, 2015

(65) Prior Publication Data

US 2016/0322340 A1    Nov. 3, 2016

(51) Int. Cl.
*H01L 23/34* (2006.01)
*H01L 25/18* (2006.01)
(Continued)

(52) U.S. Cl.
CPC .......... *H01L 25/18* (2013.01); *H01L 23/055* (2013.01); *H01L 23/3675* (2013.01); *H01L 23/3677* (2013.01); *H01L 25/0657* (2013.01); *H01L 25/50* (2013.01); *H01L 21/6835* (2013.01); *H01L 23/13* (2013.01); *H01L 24/05* (2013.01); *H01L 24/13* (2013.01); *H01L 24/16* (2013.01); *H01L 24/32* (2013.01); *H01L 24/33* (2013.01); *H01L 24/73* (2013.01); *H01L 24/83* (2013.01); *H01L 24/92* (2013.01); *H01L 2221/68331* (2013.01); *H01L 2224/0401* (2013.01); *H01L 2224/05082* (2013.01); *H01L 2224/05147* (2013.01); *H01L 2224/05171* (2013.01); *H01L 2224/05644* (2013.01); *H01L 2224/05664* (2013.01); *H01L 2224/131* (2013.01); *H01L 2224/13147* (2013.01); *H01L 2224/13155* (2013.01); *H01L 2224/16146* (2013.01); *H01L 2224/16227* (2013.01); *H01L 2224/16235* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01);
(Continued)

(58) Field of Classification Search
CPC ..... H01L 21/56; H01L 23/10; H01L 23/3675; H01L 23/49827; H01L 23/5389; H01L 24/03; H01L 25/0657; H01L 25/18; H01L 25/50
USPC ........ 257/685, 686, 706, 712, 713; 438/109, 438/122, 125
See application file for complete search history.

(56) References Cited

U.S. PATENT DOCUMENTS

2004/0212065 A1* 10/2004 Wang .................. H01L 25/0657
257/686
2007/0216001 A1* 9/2007 Nakamura ............ H01L 21/561
257/678
(Continued)

*Primary Examiner* — Hung Vu
(74) *Attorney, Agent, or Firm* — Brooks, Cameron & Huebsch, PLLC (57) ABSTRACT

Semiconductor die assemblies and methods of forming the same are described herein. As an example, a semiconductor die assembly may include a thermally conductive casing, a first face of a logic die coupled to the thermally conductive casing to form a thermal path that transfers heat away from the logic die to the thermally conductive casing, a substrate coupled to a second face of the logic die, and a die embedded at least partially in a cavity of the substrate.

24 Claims, 4 Drawing Sheets

(51) Int. Cl.
    *H01L 25/065*     (2006.01)
    *H01L 23/367*     (2006.01)
    *H01L 25/00*     (2006.01)
    *H01L 23/055*     (2006.01)
    *H01L 23/13*     (2006.01)
    *H01L 23/00*     (2006.01)
    *H01L 21/683*     (2006.01)

(52) U.S. Cl.
    CPC ............... *H01L 2224/83102* (2013.01); *H01L 2224/83191* (2013.01); *H01L 2224/92225* (2013.01); *H01L 2225/06513* (2013.01); *H01L 2225/06517* (2013.01); *H01L 2225/06541* (2013.01); *H01L 2225/06548* (2013.01); *H01L 2225/06572* (2013.01); *H01L 2225/06589* (2013.01); *H01L 2924/1431* (2013.01); *H01L 2924/1434* (2013.01); *H01L 2924/157* (2013.01); *H01L 2924/15153* (2013.01); *H01L 2924/15159* (2013.01); *H01L 2924/15311* (2013.01); *H01L 2924/15787* (2013.01); *H01L 2924/15793* (2013.01); *H01L 2924/16251* (2013.01); *H01L 2924/16747* (2013.01)

(56) References Cited

U.S. PATENT DOCUMENTS

2012/0299173 A1*   11/2012   Mohammed ........ H01L 23/3677
                                                                257/686
2013/0119528 A1     5/2013   Groothuis et al.

\* cited by examiner

SEMICONDUCTOR DIE ASSEMBLY AND METHODS OF FORMING THERMAL PATHS

TECHNICAL FIELD

The present disclosure relates generally to semiconductor die assemblies and methods, and more particularly to semiconductor die assemblies having an embedded memory die.

BACKGROUND

Semiconductor based devices including a number of semiconductor dies can be used in a variety of electronic applications, such as personal computers, cell phones, digital cameras, and other electronic devices. Various semiconductor die assemblies comprise stacked die packages. A stacked die package can refer to multiple semiconductor dies stacked (e.g., vertically) in a single package. The dies in such stacked packages can be interconnected by electrically coupling bond pads of the individual dies with bond pads of adjacent dies using through-silicon vias (TSVs), for example.

DETAILED DESCRIPTION

Semiconductor die assemblies and methods of forming the same are described herein. As an example, a semiconductor die assembly may include a thermally conductive casing, a first face of a logic die coupled to the thermally conductive casing to form a thermal path that transfers heat away from the logic die to the thermally conductive casing, a substrate coupled to a second face of the logic die, and a die embedded at least partially in a cavity of the substrate.

Some semiconductor die assemblies include a stacked die package. Various components of a stacked die package can generate a significant amount of heat. As an example, a logic die coupled to a stack of memory dies, for instance, may generate an undesirable amount of heat, which can adversely affect operation of the memory die stack (e.g., by raising the temperature of the stack above a desired operational threshold). Such temperature increases may become particularly evident as a density of the dies in the stacked die package increases.

Figure 1:
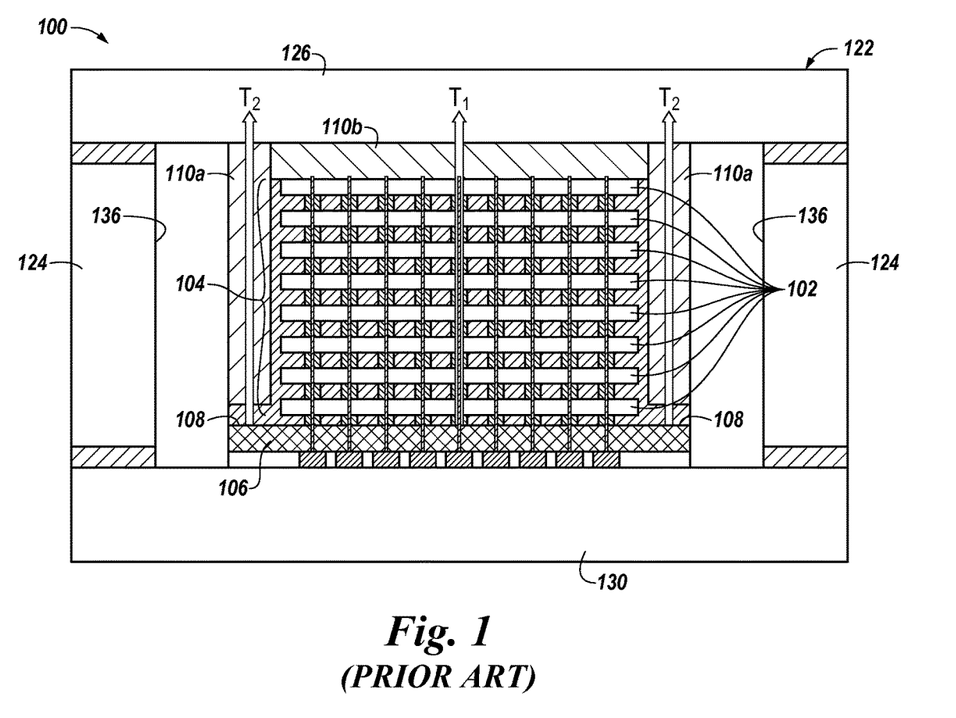
FIG. 1 illustrates an example of a semiconductor die assembly in accordance with the prior art.

Some previous approaches may employ stacked die packages with multiple thermal paths and/or at least one or a plurality of semiconductor dies arranged in a stack on a second semiconductor die. For instance, FIG. 1 illustrates an example semiconductor die assembly 100 in accordance with the prior art. The assembly 100 includes multiple thermal paths (illustrated by arrows $T_1$ and $T_2$, as described herein) through a stack 104 of semiconductor dies 102 on a semiconductor die 106.

The die 106 can have a larger footprint than the dies 102 of stack 104. For instance, in this example, the die 106 includes a peripheral portion 108 extending laterally outward beyond at least one side of the stack 104. The assembly 100 can further include a first thermal transfer feature 110a at the peripheral portion 108 of the die 106 and an optional second thermal transfer feature 110b superimposed with the dies 102. During operation, heat (e.g., thermal energy) generated by die 106 can flow away from the die 106 through the dies 102 via a first thermal path (e.g., as illustrated by arrow $T_1$) and through the first thermal transfer feature 110a via a second thermal path (e.g., illustrated by arrows $T_2$) separate from the first thermal path $T_1$. The second thermal path $T_2$ illustrated in FIG. 1 is accordingly spaced laterally apart from the perimeter of the dies 102.

The first and second thermal transfer features 110a and 110b can thermally contact a thermally conductive casing 122 that extends at least partially around the first and second semiconductor dies 102 and 106, respectively. The casing 122 can include an outer portion 124 spaced laterally apart from the die 106 on the package substrate 130 and a cap portion 126 carried by the outer portion 124. The outer portion 124 and the cap portion 126 form a recess 136 configured such that both the vertically-extending first thermal transfer feature 110a and the second thermal transfer feature 110b thermally contact an underside of the cap portion 126. Although not shown in FIG. 1, the package substrate 130 can be coupled to an underlying base structure such as a printed circuit board (PCB), for example.

The semiconductor dies 102 and 106 (collectively referred to as "dies 102, 106") can include various types of semiconductor components and functional features, such as dynamic random-access memory (DRAM), static random-access memory (SRAM), flash memory, other forms of integrated circuit memory, processing circuits, imaging components, and/or other semiconductor features.

As an example, the assembly 100 can be configured as a hybrid memory cube (HMC) in which the dies 102 are DRAM dies and/or other memory dies that provide data storage and the die 106 can be a logic die that provides memory control (e.g., DRAM control) and/or other functions within the HMC. For instance, the assembly 100 can include a plurality of first semiconductor dies 102 (e.g., memory dies) arranged in a stack 104 on a second semiconductor die 106 (e.g., a high-speed logic die that provides memory control within the HMC) in an effort to promote transfer of heat from the logic die along a thermal path extending through the plurality of semiconductor dies to the thermally conductive casing 122. Put another way, at least some of the heat generated by a second semiconductor die 106 (e.g., a logic die) of the other approaches has to pass through the stack 104 to reach the thermally conductive casing 122.

In contrast, embodiments of the present disclosure are directed to semiconductor die assemblies having an embedded semiconductor die and methods of forming the same. An embedded semiconductor die can refer to a semiconductor die that is at least partially embedded in a substrate of a semiconductor die assembly. For instance, in various embodiments, a semiconductor die assembly can include a thermally conductive casing, a first face of a logic die coupled to the thermally conductive casing to form a thermal path that transfers heat away from the logic die to the thermally conductive casing, a substrate coupled to a second face of the logic die, and a semiconductor die (e.g., memory die) embedded at least partially in a cavity of the substrate. Embodiments of the present disclosure can provide benefits such as improved thermal performance as compared to previous approaches. For instance, a number of embodiments can reduce instances of overheating as compared to previous approaches by providing comparatively faster heat transfer away from a logic die due to comparatively lower path resistance facilitated, at least in part, by the embedded semiconductor die.

Figure 2:
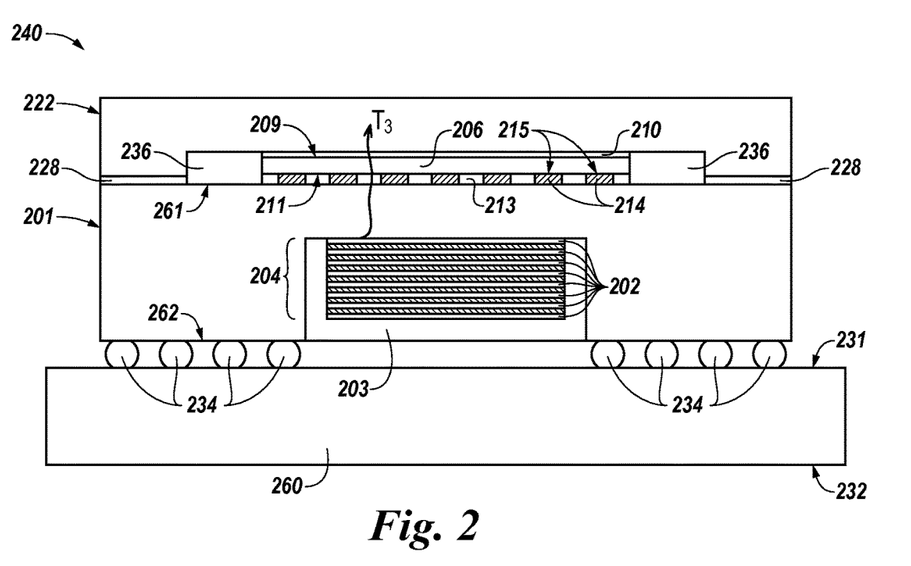
FIG. 2 illustrates an example of a semiconductor die assembly in accordance with a number of embodiments of the present disclosure.

FIG. 2 illustrates a cross-sectional view of an example of a semiconductor die assembly 240 in accordance with a number of embodiments of the present disclosure. In this example, the assembly 240 includes a plurality of semiconductor dies 202 (e.g., a plurality of memory dies) arranged in a stack 204. In a number of embodiments, and as illustrated in FIG. 2, the stack 204 of semiconductor dies 202 is embedded in a cavity 203 formed in a substrate 201. In contrast, other approaches include a stack of semiconductor dies formed on a logic die, which is formed on a package substrate (e.g., assembly 100 shown in FIG. 1). As illustrated in FIG. 2, in a number of embodiments, the stack 204 is embedded entirely in the cavity 203 of the substrate 201 (e.g., a depth of the cavity 203 is greater than a height of the stack 204). However, embodiments are not so limited. For instance, the stack 204 may be only partially embedded in the cavity 203.

In various embodiments, the semiconductor dies 202 can be memory dies. That is, similar to elements described with respect to FIG. 1, the semiconductor dies 202 and the logic die 206 (collectively referred to as "dies 202, 206") can include various types of semiconductor components and functional features, such as DRAM, SRAM, flash memory, other forms of integrated circuit memory, processing circuits, imaging components, and/or other semiconductor features. In various embodiments, for example, the assembly 240 can be configured as a HMC in which the stacked semiconductor dies 202 are DRAM dies or other memory dies that provide data storage and the logic die 206 is a high-speed logic die that provides memory control (e.g., DRAM control) within the HMC. In other embodiments, the semiconductor dies 202 and the logic die 206 may include other semiconductor components and/or the semiconductor components of the individual semiconductor dies 202 in the stack 204 may differ.

The semiconductor dies 202 and the logic die 206 can be rectangular, circular, and/or other suitable shapes and may have various different dimensions. For example, the individual semiconductor dies 202 can each have a length of about 10-11 mm (e.g., 10.7 mm) and a width of about 8-9 mm (e.g., 8.6 mm, 8.7 mm) among other possible dimensions suitable to embed at least a portion of the semiconductor dies 202 in the cavity 203, as described herein. The second semiconductor die 206 can have a length of about 12-13 mm (e.g., 12.67 mm) and a width of about 8-9 mm (e.g., 8.5 mm, 8.6 mm, etc.). In other embodiments, the semiconductor dies 202 and the logic die 206 can have other suitable dimensions and/or the individual semiconductor dies 202 may have different dimensions from one another.

In a number of embodiments, the semiconductor dies 202 can be electrically coupled to one another and/or to the logic die 206 by a plurality of conductive vias. For example, conductive vias can extend through the semiconductor dies 202 (e.g., memory dies) and/or to through the substrate 201 to the logic die 206 and/or through the substrate 201 to an underlying base structure 260, which can be a PCB, for instance. In some embodiments, through silicon vias (TSVs) can couple the semiconductor dies 202 to one another. A TSV can be a via containing a conductive material that extends through silicon of the semiconductor device. TSVs may be utilized as electrical connections, in a three-dimensional (3D) electronic device, for instance. Notably and in contrast to other approaches utilizing a stack of semiconductor dies formed on a logic die including a TSV (i.e., with the logic die orientated in an upward and opposite direction relative to a carrying substrate such as is illustrated in FIG. 1), the logic die 206 does not include a TSVs, which can enable a thicker, comparatively more manufactural semiconductor die 206 to be employed. A thicker semiconductor die may be desired for some applications due to thermal and/or mechanical considerations and/or which may ease formation of the logic die 206 and/or the semiconductor die assembly 240 including the logic die 206, among other advantages.

The substrate 201 can be a wafer, for example, and can be formed of a number of suitable substrate materials including organic materials (e.g., fullerene, oentacene, rubrene, sapphire, etc.) and/or other substrate structures (e.g., silicon-on-sapphire, etc.) having a cavity 203 formed therein. The cavity 203 is configured to receive the stack 204 of semiconductor dies 202. As illustrated in FIG. 2, the cavity 203 extends through only a portion of the substrate. For example, in various embodiments, the cavity 203 extends from a face 262 (i.e., the face of the substrate 201 adjacent to the base structure 260 and/or having the comparatively farthest proximity from the logic die 206) of the substrate 201 through a portion of the substrate 201. A remaining portion of the substrate 201 extends from a face 261 (i.e., a face of the substrate having the closest proximity to the logic die 206) of the substrate 201 to an innermost wall of the cavity 203 relative to (e.g., furthest from) the second face 262 of the substrate 201. However, the present disclosure is not so limited. That is the cavity 203 can, in some embodiments extend through the substrate 201 to enable the semiconductor dies 202 to be adjacent to and in physical contact with the second face 211 of the logic die 206.

In various embodiments, a semiconductor die (e.g., a memory die) is embedded entirely in the cavity of the substrate. However, while the semiconductor dies 202 are illustrated as a plurality of semiconductor dies entirely disposed in the cavity 203 the present disclosure is not so limited. Rather, the semiconductor dies 202 can be at least partially disposed in the cavity 203. Being partially disposed refers to at least a portion of one or a plurality of the semiconductor dies 202 being included in a volume of the cavity 203, where the volume is defined at least in part by the walls of the cavity 203 (e.g., defined by the walls of the cavity and a plane extending from the second face 262 of the substrate 201 across the cavity 203). The semiconductor dies 202 disposed in the cavity 203 can occupy some or all of the volume of the cavity 203. Put another way, the semiconductor dies 202 may be entirely included in a volume of the cavity or more may have at least a portion of the semiconductor dies 202 extending out of the volume of the cavity 203.

Regardless of the presence or absence of TSVs extending though silicon between the semiconductor dies 202, the substrate 201 includes plurality of conductive vias (omitted in FIG. 2 for ease of illustration)(e.g., conductive vias illustrated in FIG. 3B as 307) electrically coupled to semiconductor dies 202 (e.g., the stack 204 of semiconductor dies) to the logic die 206. Notably, the conductive vias each have a pitch of not greater than 200 microns (i.e., are high-speed vias). The conductive vias promote communication between the logic die 206 and the semiconductor dies 202. For example, the logic die 206 can control operation of the semiconductor dies 202 via communication through the conductive vias. Notably, the logic die 206 does not include a TSV due to the logic die 206 being orientated with logic circuitry facing towards the semiconductor dies 202.

In various embodiments, a number of metallic (e.g., solder, copper, nickel) bumps 214 are placed between an upper face of 261 the substrate 201 and the lower face 211 of the semiconductor logic die 206. Prior to the "bumping" process, a number of underbump metallization (UBM) pads 215 are formed on the logic die 206 surface.

A corresponding number of metallic pads (not shown in FIG. 2) are formed on the substrate 201 during its fabrication. For example, a UBM 215 can be formed on the first face 211 of the logic die 206 such that the UBM 215 is adhered to a conductive via (e.g., a high-speed conductive via). For instance, a UBM 215 can be formed on each conductive via. The UBMs 215 can be utilized to electrically connect portions of the assembly 240 and/or to connect the assembly 240 to a number of other semiconductor devices and/or other components of an electronic device. The UBM material is chosen from various electrically conductive materials. Examples of the UBM materials include an adhesion layer (e.g., chrome), seed lay (e.g., copper), and a solder-wettable layer (e.g., gold or palladium), among others. A physical gap between the semiconductor logic die 206 and the substrate 201 is filled with an underfill material 213, for instance, by a capillary action.

In various embodiments, the substrate 201 is included in a substantially vertical thermal path (illustrated as $T_3$) that transfers heat away from the semiconductor dies 202 in the stack 204 to the casing 222. That is, the substrate 201 defines a portion of the thermal path ($T_3$) transfers heat away from the stack of semiconductor dies to the casing. Similarly, the logic die 206 defines a portion of the thermal path ($T_3$). For instance, in various embodiments, at least a portion of the substrate is located between the logic die 206 and the semiconductor dies 202 to promote the transfer of heat away from semiconductor dies 202 to the casing while maintaining improved heat transfer from the logic die 206 to the casing 222 as compared to other approaches that rely on multiple thermal paths and/or have at least one or a plurality of semiconductor dies arranged in a stack on a second semiconductor die. Put another way, a distance of a thermal path from the logic die 206 to the casing 222 is comparatively less than a distance from the semiconductor dies 202 to the casing 222 extending along the same plane as the distance of the thermal path from the logic die 206 to the casing 222.

The substrate 201 can be disposed on the base structure 260. The base structure 260 can provide the semiconductor dies 202 and the logic die 206 with electrical connections to external electrical components (e.g., higher-level packaging; not shown for ease of illustration). For example, the base structure 260 can be an interposer or PCB that includes semiconductor components (e.g., doped silicon wafers or gallium arsenide wafers), non-conductive components (e.g., various ceramic substrates, such as aluminum oxide ($Al_2O_3$), aluminum nitride (AlN), etc.), and/or conductive portions (e.g., interconnecting circuitry, TSVs, etc.). In the embodiment illustrated in FIG. 2, the base structure 260 is electrically coupled to the substrate 201. The semiconductor dies 202 may be electrically coupled to the base structure 260.

A first face 231 of the base structure 260 is electrically coupled to face 262 of the substrate 201 via a plurality of electrical connectors 234. The electrical connectors 234 can be solder balls, conductive bumps and pillars, conductive epoxies, and/or other suitable electrically conductive elements.

A dielectric underfill (not shown for ease of illustration) can be spaced between the substrate 201 and the base structure 260 for enhanced mechanical connection and electrical isolation of the electrical connectors 234. In various embodiments, the base structure 260 can be made from a material with a relatively high thermal conductivity to enhance heat dissipation at the back side of the semiconductor dies 202.

The logic die 206 includes a first face 209 and a second face 211. The first face 209 and the second face 211 are opposing faces of the logic die 206. As illustrated in FIG. 2, the substrate 201 is coupled to the second face 211 of the logic die 206. That is, when the assembly 240 is arranged as a HMC, the logic die 206 can overlay at least a portion of the semiconductor dies 202 when positioned substantially vertically as illustrated in FIG. 2, in contrast to other approaches relying on an underlying logic die relative to semiconductors dies carried by the underlying logic die. Advantageously, the logic die 206, which typically operates at a higher power level than the semiconductor dies 202 (e.g., 15-20 W compared to 0.628 W each) generates a significant amount of heat that can desirably be directly conveyed by a thermal path that does not include the semiconductor dies 202 to a thermally conductive casing, as described herein.

In various embodiments, the first face 209 of the logic die 206 is coupled to the thermally conductive casing 222 to form a thermal path (illustrated as T3) that transfers heat away from the logic die 206 to the thermally conductive casing 222. The casing 222 can be made from a thermally conductive material (e.g., copper). For example, the casing 222 can be a heat spreader (i.e., a single cavity lid) including a conductive material such as copper.

The casing 222 includes a second portion (i.e., an outer portion) spaced laterally apart from the logic die 206 and a first portion (i.e., a cap portion) carried by the second portion. The second portion and the first portion can form a recess to at least partially enclose the logic die 206 included in the recess. In various embodiments, at least some of the first portion of the casing 222 overlays the logic die 206. The second portion does not overlay the logic die 206. The second portion of the casing 222 can be coupled to the substrate 201.

For instance, as illustrated in FIG. 2, the casing 222 can be attached to the substrate 201 with an adhesive 228 such as a thermal interface material (TIM) (i.e., a lid attach adhesive). As illustrated in FIG. 2, a layer of TIM 210 can be located on a first face 209 of the logic die 206. In various embodiments the logic die 206 is positioned in a stack between the casing 222 and the semiconductor dies 202 to desirably promote heat transfer away from the logic die 206 to the casing 222. For example, in various embodiments, the casing 222 is adjacent to and in direct physical contact with the entire first face 209 (i.e., along an entirety of a surface area of the first face 209 of the logic die) of the logic die 206 to promote heat transfer away from the logic die 206 to the casing 222.

Figure 3A:
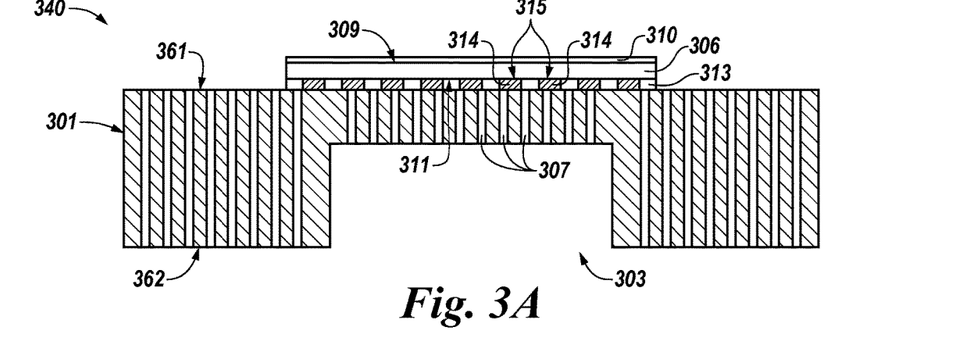
FIGS. 3A-3D illustrate various process stages associated with forming an example of a semiconductor die assembly in accordance with a number of embodiments of the present disclosure.

The embedded semiconductor die may be formed by a number of processes. FIGS. 3A-3D illustrate various process stages associated with forming an example of a semiconductor die assembly in accordance with a number of embodiments of the present disclosure. FIG. 3A illustrates a cross-sectional portion of a semiconductor die assembly 340 ("assembly 340") in accordance with a number of embodiments of the present disclosure. As illustrated in FIG. 3A, the assembly 340 can include a substrate 301, which can be analogous to substrate 201 shown in FIG. 2. As discussed, the substrate 301 can include opposing faces 361 and 362.

During processing of the assembly 340, the assembly 340 can be mounted to a wafer holder (not shown for ease of illustration). Mounting the assembly 340 to a wafer holder may facilitate a number of processing steps. To help the assembly 340 remain mounted to the wafer holder a temporary adhesive may be utilized. An example of the temporary adhesive is glue.

As mentioned, the assembly 340 can include a plurality of conductive vias. As illustrated in FIG. 3A, the conductive vias 307 extend entirely through the substrate 301. The conductive vias 307 can extend from the first face 361 to the second face 362. To obtain the assembly 340, a portion of the substrate 301 (not illustrated) can be removed to expose a portion of the conductive vias 307. For example, the substrate 301 can be etched (e.g., dry etched) to expose a portion of the conductive vias.

As mentioned, the assembly 340 can include a plurality of conductive vias 307 (e.g., high-speed conductive vias). As illustrated in FIG. 3A, the conductive vias 307 extend through the substrate 301. The conductive vias 307 can extend from the first face 361 to the cavity 303 to enable communication between the logic die 306 and semiconductor dies disposed in the cavity, as describe herein. As discussed, a UBM 315 can be formed on the logic die surface 206 (e.g., prior to forming a metallic bump 314). A physical gap between the semiconductor logic die 306 and the substrate 301 is filled with an underfill material 313, for instance, by a capillary action.

The conductive vias 307 can include a liner material. A barrier material, an oxide material, or a combination thereof may be utilized as the liner material. An example of the barrier material is tantalum, among others. An example of an oxide material is silicon oxide, among others. The conductive vias can include a conductive material. Examples of the conductive material include, but are not limited to copper, tungsten, and aluminum. The conductive vias 307 can have a diameter in a range from 3 microns to 15 microns. The conductive vias 307 can have a diameter in a range from 3 microns to 12 microns, from about 3 microns to 10 microns, or 4 microns to 8 microns. Some embodiments of the present disclosure provide that the conductive vias 307 can have a diameter of about 5 microns. As mentioned, the conductive vias 307 each have a pitch of not greater than 200 microns (i.e., are high-speed vias).

The conductive vias 307 may be formed by a number of processes. For example, a layer of photoresist can be applied to a surface (e.g. an upper/upward facing surface) of a wafer. Thereafter, the wafer can be patterned. An etching process, such as a deep reactive-ion etching process, can be utilized to create vias in the patterned wafer. For various applications, a number of materials may be applied to the vias. For instance, a liner material, such as an oxide, can be applied to the vias. The vias can be filled with a conductive material, such as copper, tungsten, or aluminum. At this stage the filled vias do not extend completely through the wafer. The layer of photoresist can be removed and the wafer can be mounted on a wafer holder (e.g., by utilizing a temporary adhesive such as a glue). The wafer can undergo a thinning process, such as etching until the conductive material filling the vias extends all the way through the wafer. For various applications the semiconductor die assembly can include differing numbers of TSVs (not shown) and/or conductive vias 307. The TSVs and/or the conductive vias 307 can be arranged in an array, for example.

After formation of the conductive vias 307 (e.g., after the conductive vias 307 extend all the way through the wafer), and in some embodiments, after formation of the TSVs (not shown), a number of further processing steps can be performed for various applications. For instance, a UBM 315 can be formed on a surface (e.g., the first surface 311 of the logic die 306) of the assembly 340 such that the UBM 315 is adhered to a respective conductive via 307. After formation of the UBMs, the wafers can be cut to form a number of relatively smaller semiconductor devices (e.g. dies). This process can include adhering the wafer to dicing tape prior to cutting.

Figure 3B:
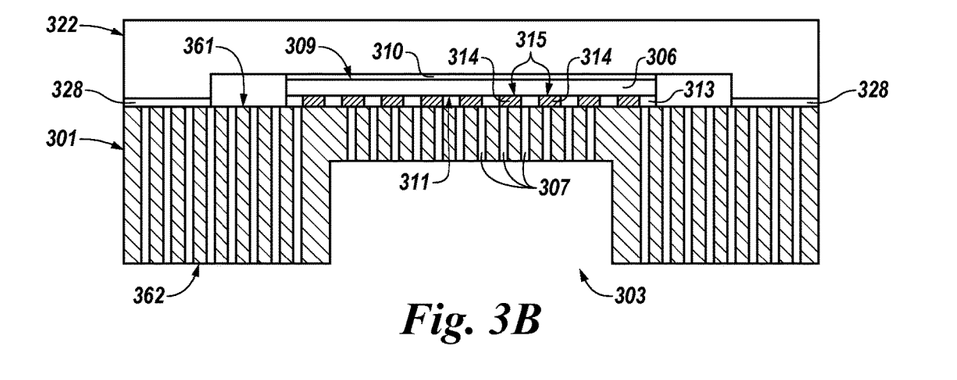

The cavity 303 can be formed using techniques such as sand drilling, mechanical drilling, etching, laser, an air aided laser, a water aided laser, and/or combinations thereof, among other suitable techniques. As mentioned, the cavity 303 is configured to receive the semiconductors dies, for instance, as described herein with regard to FIG. 3C. In various embodiments, the cavity is formed subsequent to processing of the conductive vias 307. As mentioned and as illustrated in FIG. 3B, the cavity 303 extends through only a portion of the substrate. The substrate can have a thickness (e.g., 1 millimeter) that is greater than a depth of the cavity 303 (i.e., a depth from the second face 262 of the substrate 301 to an innermost surface of the cavity 303).

As illustrated in FIG. 3A, the process can include coupling a logic die 306 to a first face 361 of the substrate 301. Herein, "coupling" and "formed on" may refer to two materials in contact with one another, or two materials having a number of other materials there between. As illustrated in FIG. 3A, the logic die 306 can be coupled to a first face 361 of the substrate 301 (e.g., through bumps 314 and corresponding UBMs 315). In various embodiments, the logic die 306 can be coupled to the first face 361 of the substrate 301 subsequent to forming the cavity 303 in the substrate 301.

FIG. 3B illustrates the assembly 340 of FIG. 3A at a subsequent processing stage. As illustrated in FIG. 3B, the process can include coupling a thermally conductive casing 322 to the logic die 306. A layer of TIM 310 can be applied to the logic die (e.g., applied to a first face 309 of the logic die 306) prior to coupling the casing 322 to the logic die 306.

Figure 3C:
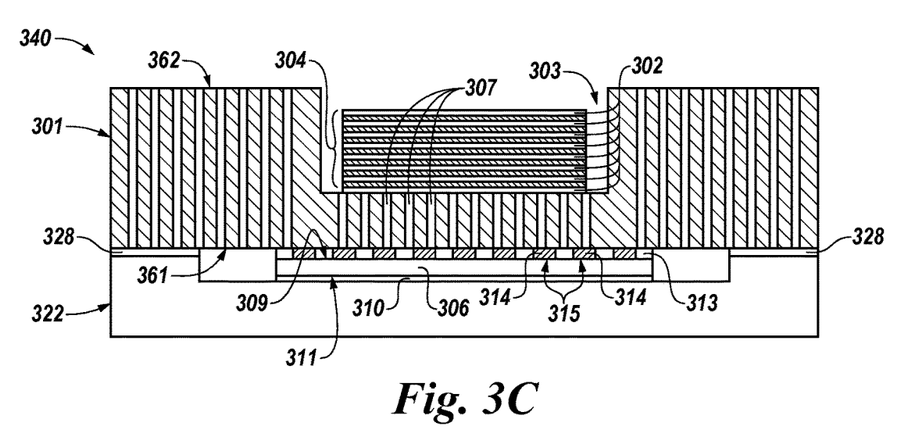

FIG. 3C illustrates the assembly 340 of FIG. 3B at a subsequent processing stage. As illustrated in FIG. 3C, the process can include embedding one or a plurality of semiconductor dies 302 ("semiconductor dies 302") in the cavity 303 extending from the second face 362 of the substrate 301 through a portion of the substrate 301, where the cavity 303 is configured to receive the semiconductor dies 302 to form a thermal pathway (e.g., a substantially vertical thermal pathway) extending from the semiconductor dies 302 through a remaining portion of the substrate 301 and the logic die 306 to the thermally conductive casing 322.

In some embodiments, the process can include flipping the substrate 301 (i.e., inverting the substrate from the orientation illustrated in FIG. 3B to the orientation illustrated in FIG. 3C) and embedding the semiconductor dies 302 in the cavity 303 subsequent to flipping the substrate 301. For example, the semiconductor dies 302 can be one of a plurality of pre-stacked memory dies. In such an example, the process can include embedding the plurality of pre-stacked memory dies in the cavity 303 subsequent to flipping the substrate 301.

Figure 3D:
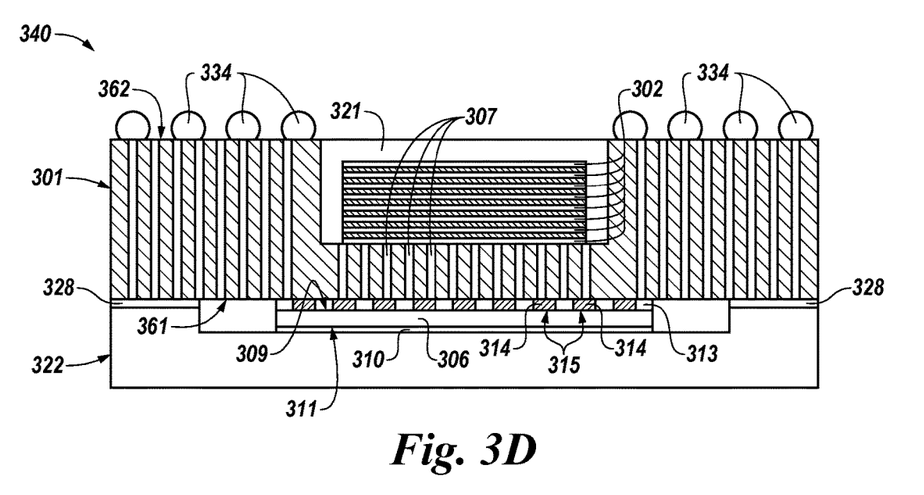

FIG. 3D illustrates the assembly 340 of FIG. 3C at a subsequent processing stage. As illustrated in FIG. 3D, the process can include encapsulating the semiconductor die embedded in the cavity with an electrically insulating material 321 and/or performing various flip chip techniques such as disposing electrical connectors 334, as described herein, on the substrate 301. Examples of electrically insulating material 321 include various epoxies and/or plastics, among other suitable electrically insulating materials to electrically insulate the semiconductor dies 302 and/or adhere the semiconductors dies 302 disposed in the cavity 303 to walls of the cavity 303.

In some embodiments, the process can include disposing a UBM 315 on at least a portion (e.g., on at least a portion of the first face 361) of the logic die 306 and/or at least a portion of the substrate 301. In some embodiments, the process can include coupling the logic die 306 having the UBM 315 disposed thereon to the first face 361 of the substrate. The semiconductor dies 302 can be one of a plurality of semiconductor dies electrically coupled together in a stack 304. The process can include electrically coupling the plurality of semiconductor dies to the logic die 306 via a plurality of conductive structures, as described herein, formed in the substrate 301.

As used herein, "a number of" something can refer to one or more such things. For example, a number of memory cells can refer to one or more memory cells. Additionally, the designators "M" and "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2.

Although specific embodiments have been illustrated and described herein, those of ordinary skill in the art will appreciate that an arrangement calculated to achieve the same results can be substituted for the specific embodiments illustrated. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A semiconductor die assembly, comprising:
   a thermally conductive casing;
   a first face of a logic die coupled to the thermally conductive casing to form a thermal path that transfers heat away from the logic die to the thermally conductive casing;
   a first face of a substrate coupled to a second face of the logic die, wherein the substrate includes a cavity extending from a second face of the substrate toward the first face of the substrate; and
   a memory die embedded entirely in the cavity, wherein a first face of the memory die is coupled to an innermost surface of the cavity relative to the second face of the substrate, and wherein an electrically insulating material encapsulates a second face and sidewalls of the memory die.

2. The semiconductor die assembly of claim 1, wherein the logic die is positioned in a stack between the thermally conductive casing and the memory die.

3. The semiconductor die assembly of claim 1, wherein the thermally conductive casing is adjacent to and in direct physical contact with the entire first face of the logic die.

4. The semiconductor die assembly of claim 3, wherein the thermally conductive casing includes a second portion spaced laterally apart from the logic die and a first portion carried by the second portion, and wherein at least some of the first portion is adjacent to and in direct physical contact with the logic die.

5. The semiconductor die assembly of claim 1, wherein the memory die is included in a plurality of memory dies arranged in a stack, wherein the stack is embedded in the cavity of the substrate.

6. The semiconductor die assembly of claim 5, wherein the plurality of memory dies are electrically coupled to one another by a plurality of through-silicon vias (TSVs) extending through the memory dies.

7. The semiconductor die assembly of claim 5, wherein the substrate is included in the thermal path that transfers heat away from the stack to the thermally conductive casing.

8. The semiconductor die assembly of claim 1, wherein the thermally conductive casing is a heat spreader including a conductive material.

9. The semiconductor die assembly of claim 1, wherein at least a portion of the substrate is located between the logic die and the memory die.

10. The semiconductor die assembly of claim 1, wherein high-speed vias formed in the substrate couple the logic die to the memory die.

11. A method of forming a memory die assembly, comprising:
    coupling a logic die to a first face of a substrate;
    coupling a thermally conductive casing to the logic die;
    embedding a memory die in a cavity extending from a second face of the substrate toward the first face of a substrate, wherein a first face of the memory die is coupled to an innermost surface of the cavity relative to the second face of the substrate, and wherein the cavity is configured to receive the memory die to form a thermal pathway extending from the memory die through a remaining portion of the substrate and the logic die to the thermally conductive casing; and
    encapsulating a second face and sidewalls of the memory die embedded entirely in the cavity with an electrically insulating material.

12. The method of claim 11, including flipping the substrate, and embedding the memory die in the cavity subsequent to flipping the substrate.

13. The method of claim 12, wherein the memory die is one of a plurality of pre-stacked memory dies, and wherein embedding included embedding the plurality of pre-stacked memory dies in the cavity subsequent to flipping the substrate.

14. The method of claim 11, including disposing a underbump metallization (UBM) on a portion of the logic die, and including coupling the portion of the logic die having the UBM disposed thereon to the first face of the substrate.

15. The method of claim 11, wherein the memory die is one of a plurality of memory dies electrically coupled together in a stack, and including electrically coupling the plurality of memory dies to the logic die via a plurality of conductive structures formed in the substrate.

16. A semiconductor die assembly, comprising:
a logic die having a first face and a second face;
a casing coupled to the first face of the logic die;
a first face of a substrate coupled to the second face of the logic die, wherein the substrate includes a cavity extending from a second face of the substrate toward the first face of the substrate; and
a stack of semiconductor dies entirely embedded in the cavity of the substrate, wherein a first face of the semiconductor die is coupled to an innermost surface of the cavity relative to the second face of the substrate, and wherein an electrically insulating material encapsulates a second face and sidewalls of the semiconductor die, and wherein the substrate defines a portion of a thermal path that transfers heat away from the stack of semiconductor dies to the casing.

17. The semiconductor die assembly of claim 16, wherein the logic die defines a portion of the thermal path, and wherein the thermal path transfers heat away from the logic die to the casing.

18. The semiconductor die assembly of claim 16, wherein the substrate includes plurality of conductive vias electrically coupled to the stack of semiconductor dies and having a pitch of not greater than 200 microns.

19. The semiconductor die assembly of claim 16, including an underbump metallization formed at an interface between the logic die and the substrate.

20. The semiconductor die assembly of claim 16, wherein a distance of a thermal path from the logic die to the casing is comparatively less than a distance from the stack of semiconductor dies to the casing.

21. The semiconductor die assembly of claim 16, wherein the cavity extends through only a portion of the substrate.

22. The semiconductor die assembly of claim 21, wherein the cavity extends from a second face of the substrate through a portion of the substrate, and wherein a remaining portion of the substrate extends from a first face of the substrate to an innermost wall of the cavity.

23. The semiconductor die assembly of claim 16, wherein the first face and the second face of the logic die are opposing faces of the logic die.

24. The semiconductor die assembly of claim 16, wherein the logic die does not include a TSV.

* * * * *